(12) United States Patent
Register, II et al.

(10) Patent No.: US 10,121,962 B1
(45) Date of Patent: Nov. 6, 2018

(54) METHOD FOR FABRICATING MAGNETIC SOLID STATE DEVICES

(71) Applicant: The University of Texas System Board of Regents, Austin, TX (US)

(72) Inventors: Leonard Franklin Register, II, Round Rock, TX (US); Bahniman Ghosh, Austin, TX (US); Rik Dey, Austin, TX (US); Sanjay Kumar Banerjee, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 15/589,626

(22) Filed: May 8, 2017

(51) Int. Cl.
| | | |
|---|---|---|
| *H01L 27/22* | (2006.01) | |
| *H01L 43/10* | (2006.01) | |
| *H01L 43/02* | (2006.01) | |
| *H01L 43/12* | (2006.01) | |

(52) U.S. Cl.
CPC ............ *H01L 43/10* (2013.01); *H01L 27/222* (2013.01); *H01L 43/02* (2013.01); *H01L 43/12* (2013.01)

(58) Field of Classification Search
CPC ....... H01L 43/10; H01L 27/222; H01L 43/02; H01L 43/12
See application file for complete search history.

(56) References Cited

U.S. PATENT DOCUMENTS

| | | | |
|---|---|---|---|
| 2016/0142012 A1* | 5/2016 | Wang | H03B 15/006 331/94.1 |
| 2016/0225423 A1* | 8/2016 | Naik | H01L 43/08 |

* cited by examiner

*Primary Examiner* — Dale E Page
*Assistant Examiner* — Wasiul Haider
(74) *Attorney, Agent, or Firm* — Antony P. Ng; Russell Ng PLLC

(57) ABSTRACT

A magnetic solid state device is disclosed. The magnetic solid state device includes a substrate and a topological insulator deposited on top of the substrate. The magnetic solid state device also includes a first perpendicular magnetic anisotropy (PMA) bit having a reference PMA layer located on the topological insulator, and a second PMA bit having a free PMA layer located on the topological insulator. A gate contact is utilized to receive various predetermined voltages for controlling the Ruderman-Kittel-Kasuya-Yosida (RKKY) interactions between the reference PMA layer in the first PMA bit and the free PMA layer in the second PMA bit.

6 Claims, 5 Drawing Sheets

METHOD FOR FABRICATING MAGNETIC SOLID STATE DEVICES

BACKGROUND OF THE INVENTION

1. Technical Field

The present invention relates to solid state devices in general, and in particular to a method for fabricating magnetic solid state devices.

2. Description of Related Art

Conventional spin transfer torque (STT)-based devices relies on spin-polarized current injection to a switchable free magnet through a tunnel barrier from a magnet to affect magnetic orientation. For example, conventional STT-based memories require a substantially large amount of voltage and current over the duration of switching. Various approaches for reducing the high current requirement by conventional STT-based memories have been considered. For instance, the giant spin Hall effect in metals has been utilized to switch nanomagnets, which allows for low-voltage operation and greater than unity effective spin injection efficiencies. This is because current flowing parallel to the surface of a magnet, instead of flowing through the magnet, can provide multiple opportunities per electron to transfer torque to the magnet.

Various methods of voltage-aided on induced switching of nanomagnets for reducing or eliminating the current requirement to achieve more power-efficient switching have also been considered. However, those methods rely on voltage-induced changes in the magnet's easy axis orientation and strength, which requires precise fabrication in order to achieve a nominal magnetic anisotropy on the boundary between vertical and in-plane orientation and applied voltages that would be substantial compared to complementary-metal oxide semiconductor (CMOS) logic devices.

SUMMARY OF THE INVENTION

In accordance with a preferred embodiment of the present invention, a magnetic solid state device includes a substrate and a topological insulator deposited on top of the substrate. The magnetic solid state device also includes a first perpendicular magnetic anisotropy (PMA) bit having a reference PMA layer located on the topological insulator, and a second PMA bit having a free PMA layer located on the topological insulator. A gate contact is utilized to receive various predetermined voltages for controlling the Ruderman-Kittel-Kasuya-Yosida (RKKY) interactions between the reference PMA layer in the first PMA bit and the free PMA layer in the second PMA bit.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1A:
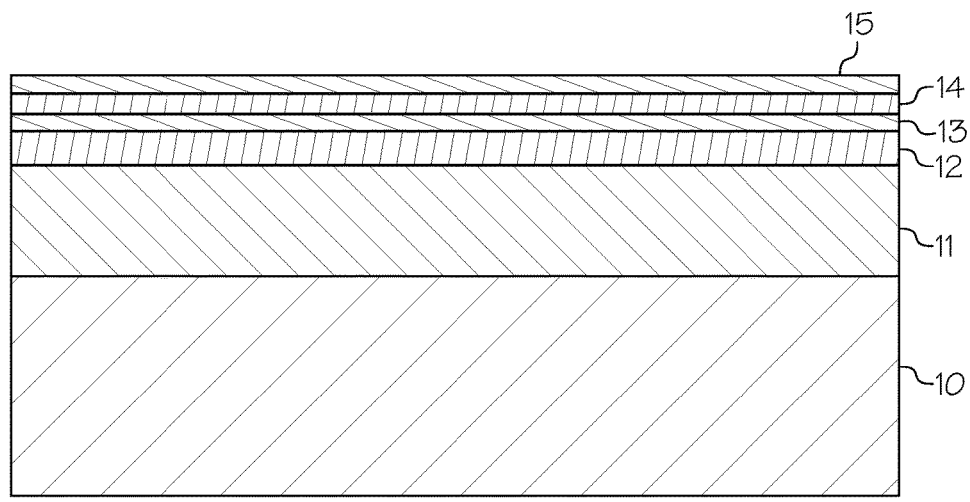
FIGS. 1A-1F are process flow diagrams of a method for fabricating a magnetic memory, in accordance with a preferred embodiment of the present invention.

Referring now to the drawings and in particular to FIGS. 1A-1F, there are illustrated process flow diagrams of a method for fabricating a magnetic memory, in accordance with a preferred embodiment of the present invention. Initially, a doped topological insulator 11 is deposited on a substrate 10. Doped topological insulator 11 is made of, for example, doped $Bi_2Se_3$ or doped $Bi_2Te_3$, with a Fermi level to the desired value in topological insulator 11. Substrate 10 is preferably made of $Si_{(111)}$ for better lattice matching with topological insulator 11. A first perpendicular magnetic anisotropy (PMA) layer 12 is then deposited on doped topological insulator 11. First PMA layer 12 is preferably made of a ferromagnetic material such as iron or cobalt. Next, a tunnel barrier oxide layer 13 is deposited on first PMA layer 12. Tunnel barrier oxide layer 13 is made of, for example, magnesium oxide (MgO) or alumina ($Al_2O_3$). In addition to acting as a tunnel barrier, layer 13 also serves to establish or strengthen the PMA in layer 12. A second PMA layer 14 is deposited on tunnel barrier oxide layer 13. Second PMA layer 14 is preferably made of a ferromagnetic material such as iron or cobalt. Then, a top oxide layer 15, preferably made of MgO, is placed on second PMA layer 14, as shown in FIG. 1A. Oxide layer 14 serves both to establish or strengthen the PMA of layer 14, and to act as a protective capping layer for subsequent processing.

The stack of oxide layer 15/PMA layer 14/oxide layer 13/PMA layer 12/topological insulator 11 in FIG. 1A can be grown in situ by molecular beam epitaxy (MBE) on substrate 10. Alternatively, various layers of films can be deposited by chemical vapor deposition (CVD) or by physical vapor deposition (PVD), such as sputtering or evaporation, if the grain sizes can be made large enough for acceptable device performance. For example, oxide layer 15 is approximately 0.7 mm thick, second PMA layer 14 is approximately 0.7 mm thick, oxide layer 13 is approximately 1.0 nm thick, and first PMA layer 12 is approximately 1.0 nm thick and topological insulator 11 is approximately 20 nm thick. The exact thicknesses of each layer would depend on the properties of the materials used.

Figure 1B:
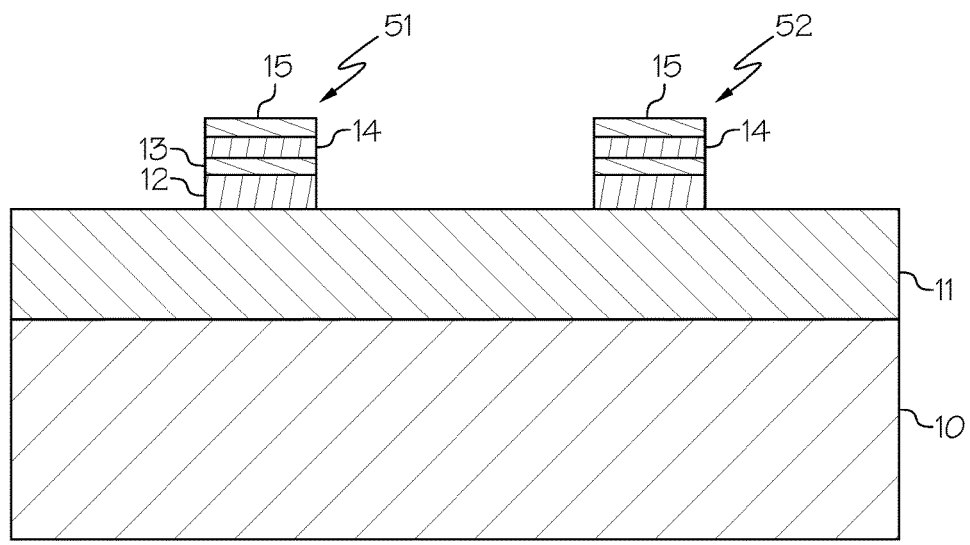

Next, PMA bit stacks 51-52 are constructed from the stack of oxide layer 15/PMA layer 14/oxide layer 13/PMA layer 12/topological insulator 11 by removing oxide layers 13, 15 and PMA layers 12, 14 via photolithography (or other patterning schemes such as electron beam or imprint lithography) and etching (such as reactive ion etching or ion milling), as depicted in FIG. 1B.

Figure 1C:
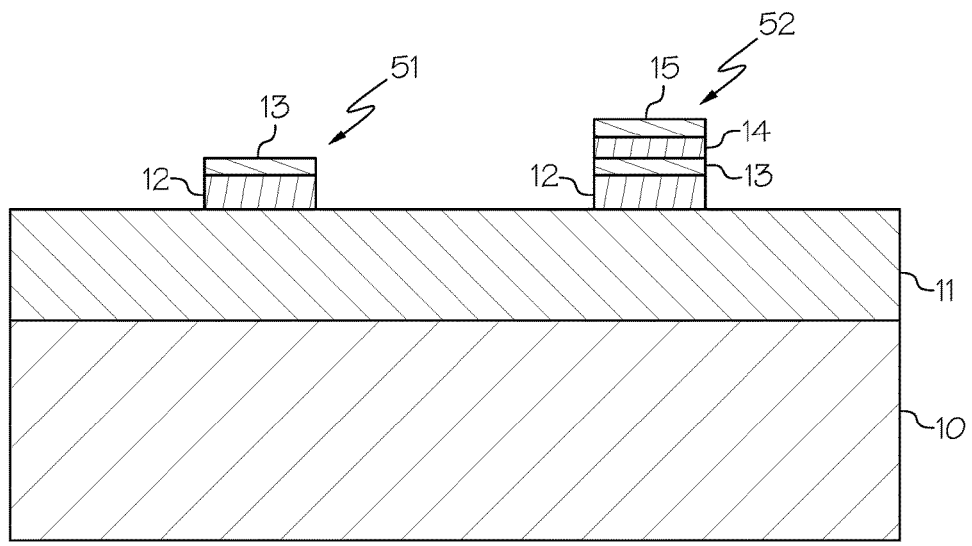

After etching had been performed on various non-PMA bit regions, except for PMA bit 52 that will be used for storage, top oxide layer 15 and PMA layer 14 are then etched away from PMA bit 51, as shown in FIG. 1C.

PMA bit 51 is to be used as a reference bit, and the thickness of PMA layer 12 within PMA bit 51 may be different than the thickness of PMA layer 12 within PMA bit 52 that is to be used for storage.

Figure 1D:
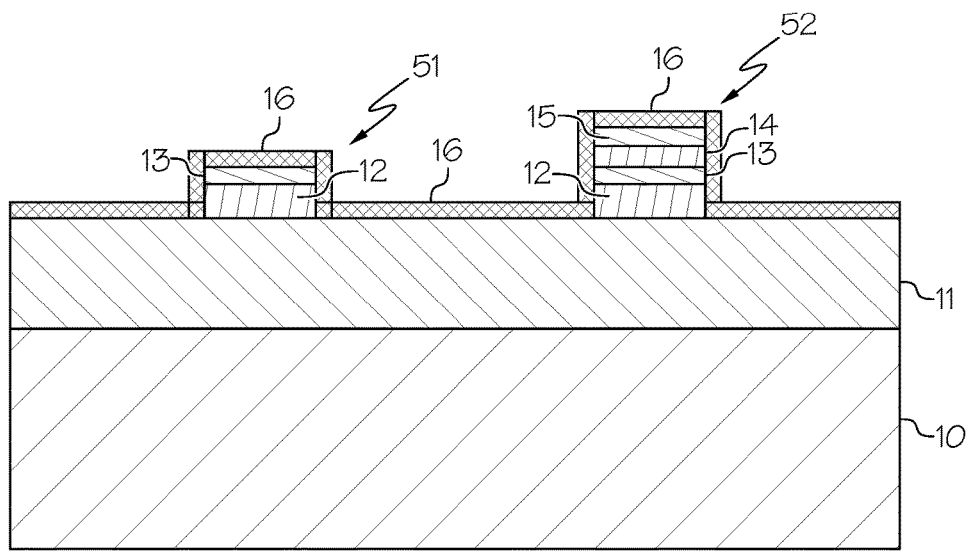

Next, an uniform gate oxide layer 16, made of MgO for example, is deposited by, for example, CVD or PVD, to cover the entire surface (i.e., non-PMA bit regions and PMA bits 51-52), as depicted in FIG. 1D.

Figure 1E:
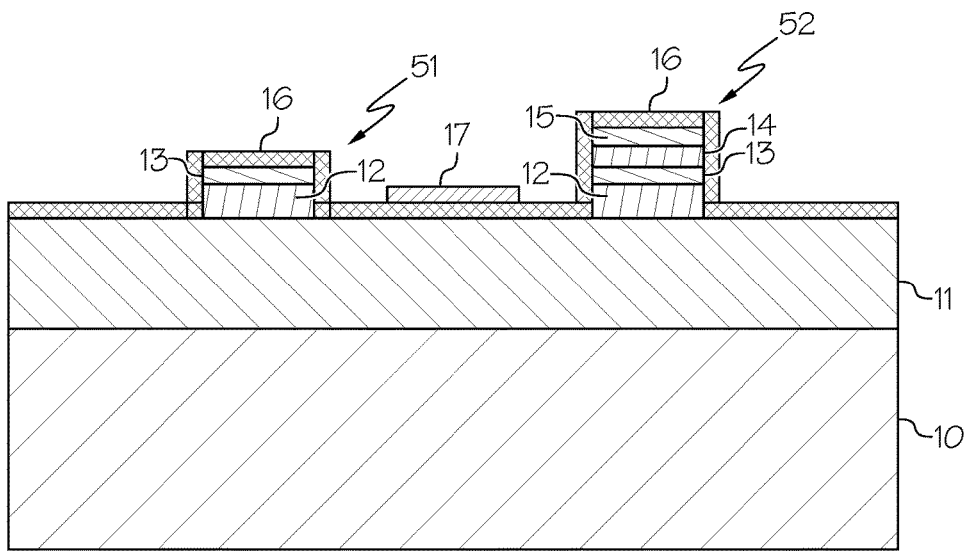

A gate metal contact 17 is then deposited on non-PMA bit region located between PMA bit 51 and PMA bit 52 for controlling the Fermi level in topological insulator 11, as shown in FIG. 1E. It is acceptable if some of gate metal contact 17 overlaps PMA bit 51, but not overlapping PMA bit 52. Gate metal contact 17 is made of, for example, aluminum, but it can also be made of any metal.

A via (opening) 18 is formed in oxide layer 15 and gate oxide layer 16 of PMA bit 52. Next, metal is deposited in via 18 to form a metal contact 19 on PMA bit 52, and other metal contacts (not shown) can be formed to connect topological insulator layer 11 by etching various locations of gate oxide layer 16 immediate above topological insulator 11, as shown in FIG. 1F.

Figure 1F:
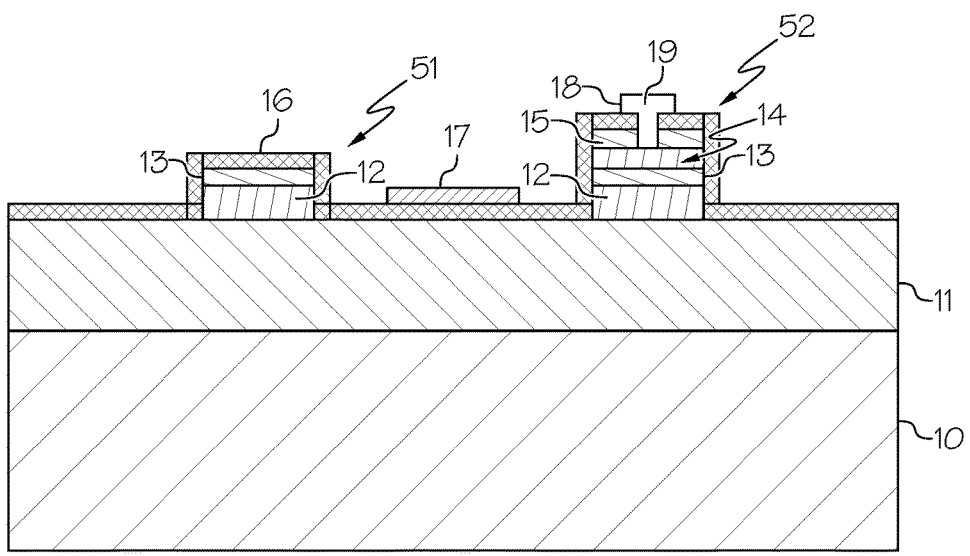

The magnetic device shown in FIG. 1F is to be used as a memory device. For the present embodiment, PMA bit 51 is a reference bit, and PMA bit 52 is a storage bit. The magnetic orientation of first PMA layer 12 in PMA bit 51 is fixed (i.e., cannot be changed subsequently) during manufacturing. On the other hand, the magnetic orientation of second PMA layer 14 in PMA bit 52 is fixed while the magnetic orientation of first PMA layer 12 in PMA bit 52 is not fixed (i.e., can be changed).

During a write operation, a specific voltage can be applied to gate metal contact 17 to control the Ruderman-Kittel-Kasuya-Yosida (RKKY) interactions between first PMA layer 12 in PMA bit 51 and first PMA layer 12 in PMA bit 52. For example, a first voltage can be applied to gate metal contact 17 to induce a ferromagnetic RKKY interaction between first PMA layer 12 in bit in PMA bit 51 and first PMA layer 12 in PMA bit 52 to cause the magnetic orientation of first PMA layer 12 in PMA bit 52 to be the same as the magnetic orientation of first PMA layer 12 in PMA bit 51, and a second voltage can be applied to gate metal contact 17 to induce an anti-ferromagnetic RKKY interaction between first PMA layer 12 in PMA bit 51 and first PMA layer 12 in PMA bit 52 to cause the magnetic orientation of first PMA layer 12 in PMA bit 52 to be different from the magnetic orientation of first PMA layer 12 in PMA bit 51. Incidentally, the same magnetic orientation being stored in PMA bit 52 can be denoted as a logical "1" or "0" as desired.

During a read operation, a voltage can be applied to metal contact 19 to drive an electrical current through first PMA layer 12 and second PMA layer 14 within PMA bit 52 in order to read out the magnetic orientation that is stored in first PMA layer 12 of PMA bit 52 via the dependence of the tunnel magneto resistance (TMR) on the relative orientations of the fixed PMA orientation of PMA layer 12 and PMA layer 14 within PMA bit 52. The voltage applied to metal contact 19, and resulting current through, PMA bit 52 should be sufficiently small such that the read operation cannot change the orientation of first PMA layer 12 in PMA bit 52 through spin transfer torque (STT). Between read and write operations, a third voltage, preferably zero volts for non-volatility, can be applied to gate metal contact 17 to reduce or eliminate the RKKY interactions between first PMA layer 12 in bit in PMA bit 51 and first PMA layer 12 in PMA bit 52 such that the magnetic ordination of first PMA layer 12 in PMA bit 52 remains unchanged with time.

Figure 2A:
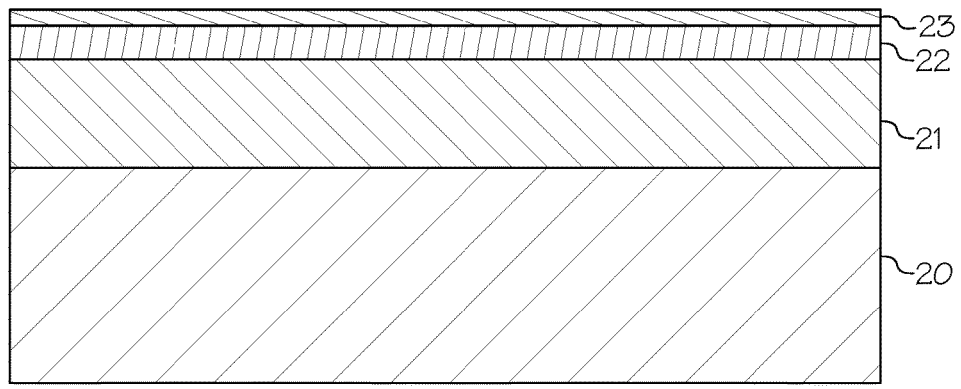
FIGS. 2A-2D are process flow diagrams of a method for fabricating a magnetic inverter, in accordance with a preferred embodiment of the present invention.

With reference now to FIGS. 2A-2D, there are illustrated process flow diagrams of a method for fabricating a magnetic inverter, in accordance with a preferred embodiment of the present invention. Initially, a doped topological insulator 21 is deposited on a substrate 20. Substrate 20 is preferably made of $Si_{(111)}$ for better lattice+matching with topological insulator 21. Doped topological insulator 21 is made of, for example, doped $Bi_2Se_3$ or doped $Bi_2Te_3$, with a Fermi level to the desired value in topological insulator 21. A PMA layer 22 is then deposited on doped topological insulator 21. PMA layer 22 is preferably made of a ferromagnetic material such as iron or cobalt. Next, an oxide layer 23 is deposited on first PMA layer 22, as shown in FIG. 2A. Oxide layer 23 is preferably made of MgO or any other oxide that generates perpendicular magnetic anistropy in PMA layer 22.

The stack of oxide layer 23/PMA layer 22/topological insulator 21 in FIG. 2A can be grown in situ by MBE on substrate 20. Alternatively, various layers of films can be deposited by CVD or by PVD, such as sputtering or evaporation, if the grain sizes can be made large enough for acceptable device performance. For example, oxide layer 23 is approximately 1.0 nm thick, and PMA layer 22 is approximately 1.0 nm thick and topological insulator 21 is approximately 20 nm thick. The exact thicknesses of each layer would depend on the properties of the materials used.

Figure 2B:
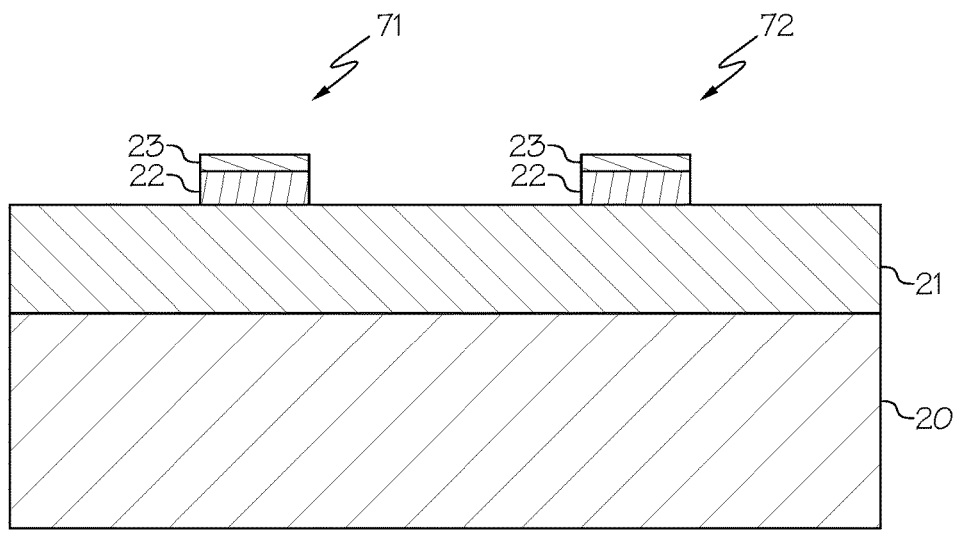

Next, bit stacks 71-72 are constructed from the stack of oxide layer 25/PMA layer 24/oxide layer 23/PMA layer 22/topological insulator 21 by removing oxide layers 23, 25 and PMA layers 22, 24 via photolithography (or other patterning schemes such as electron beam or imprint lithography) and etching (such as reactive ion etching or ion milling), as depicted in FIG. 2B.

Figure 2C:
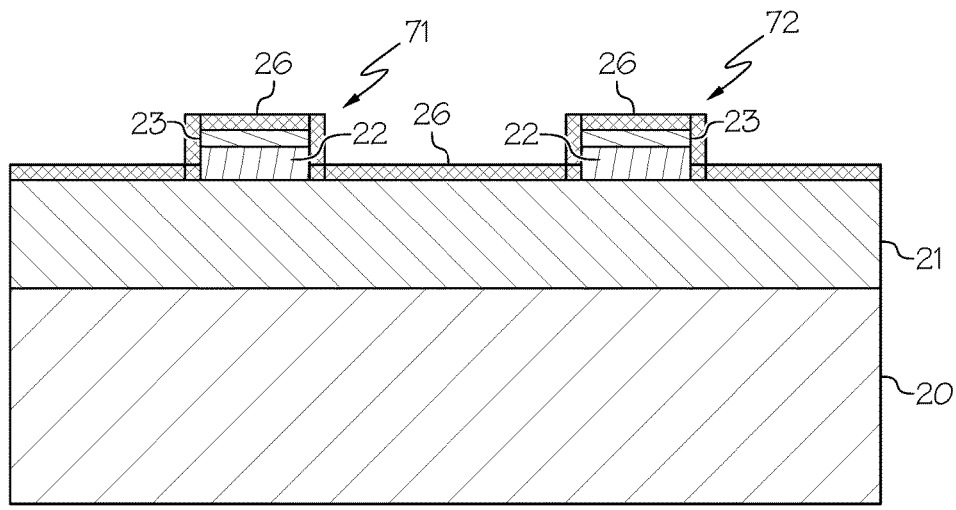

Next, an uniform gate dielectric layer 26, made of MgO for example, is deposited by, for example, CVD or PVD, to cover the entire surface, as depicted in FIG. 2C.

Figure 2D:
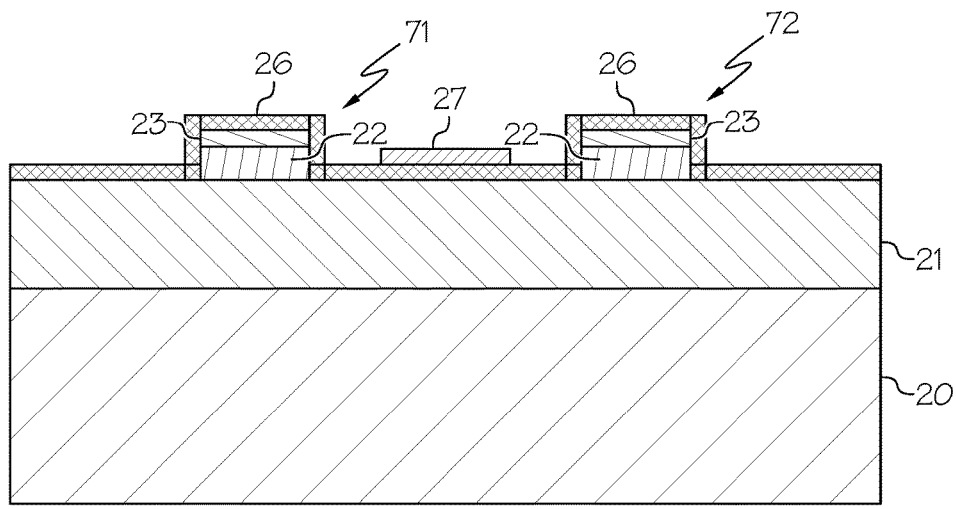

A gate metal contact 27 is then deposited on the region between bit stack 71 and bit stack 72 for controlling the Fermi level in topological insulator 21, as shown in FIG. 2D. Gate metal contact 27 is preferably made of aluminum, but it can also be made of any metal or poly.

The magnetic device shown in FIG. 2D is to be used as an inverter. For the present embodiment, bit stack 71 is an input bit for the inverter, and PMA bit 72 is an output bit for the inverter. During operation, assuming the magnetic orientation of PMA layer 22 in bit stack 71 is set to a certain orientation representing a logical "1" or "0," as one desires, a specific voltage can be applied to gate metal contact 27 to control the RKKY interactions between PMA layer 22 in bit stack 71 and PMA layer 22 in bit stack 72. For example, under a first voltage applied to gate metal contact 27, preferably zero volts for non-volatile logic applications, the RKKY interactions between bit stacks 71 and 72 would be eliminated or weakened. A second voltage can be applied to gate metal contact 27 to induce an antiferromagnetic RKKY interaction between gates bit stacks 71 and 72 and cause the magnetic orientation of PMA layer 22 in bit stack 72 to be opposite the magnetic orientation of PMA layer 22 in PMA bit 71. Notably the magnetic orientation of the input bit stack 71 would be effective fixed by continuing gated RKKY interactions with one or more preceding bit stacks (not shown) over the period of time required to set the magnetic orientation of the output bit stack 72.

The magnetic device shown in FIG. 2D also can be used as a follower. A third voltage can be applied to gate metal contact 27 to induce a ferromagnetic RKKY interaction between gates bit stacks 71 and 72 to cause the magnetic orientation of PMA layer 22 in PMA bit 72 to be opposite the magnetic orientation of PMA layer 22 in PMA bit 71. In this way, the operation performed between bit stacks 71 and 72 can be programmed by the choice of voltage applied to gate metal contact 27.

The same principles of operation can be extended to manufacture other logic gates such as AND, OR, MAJORITY and MINORITY gates having multiple input bit stack operating simultaneously on the output bit stack.

As has been described, the present invention provides a method for fabricating low-power magnetic solid state devices.

While the invention has been particularly shown and described with reference to a preferred embodiment, it will be understood by those skilled in the art that various changes in form and detail may be made therein without departing from the spirit and scope of the invention.

What is claimed is:

1. A method for fabricating a magnetic memory, said method comprising:
    forming a stack of second oxide layer/second perpendicular magnetic anisotropy (PMA) layer/first oxide/first PMA layer/topological insulator on a substrate;
    forming a plurality of PMA bits on said substrate;
    removing said second PMA layer and said second oxide layer on one of said PMA bits to form a reference PMA bit;
    depositing a gate oxide layer on said PMA bits and non-PMA bit regions;
    depositing a gate contact on a region located between said first PMA bit and said second PMA bit; and
    depositing a metal connector on said second PMA bit to form a storage PMA bit.

2. The method of claim 1, wherein said substrate is made of silicon.

3. The method of claim 1, wherein said topological insulator is made of $Bi_2Se_3$.

4. The method of claim 1, wherein said topological insulator is made of $Bi_2Te_3$.

5. The method of claim 1, wherein said first oxide and said second oxide are made of magnesium oxide.

6. The method of claim 1, wherein said PMA free layer and said second PMA reference layer are made of ferromagnetic material.

* * * * *